US007228865B2

United States Patent
Hall et al.

(10) Patent No.: US 7,228,865 B2
(45) Date of Patent: Jun. 12, 2007

(54) FRAM CAPACITOR STACK CLEAN

(75) Inventors: Lindsey H. Hall, Plano, TX (US);
Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 411 days.

(21) Appl. No.: 10/447,581

(22) Filed: May 28, 2003

(65) Prior Publication Data
US 2004/0237998 A1 Dec. 2, 2004

(51) Int. Cl.
*B08B 6/00* (2006.01)
(52) U.S. Cl. ............... 134/1.3; 134/1.1; 134/2; 134/3; 134/26; 134/27; 134/28; 134/29; 134/34; 134/36; 134/41; 134/902
(58) Field of Classification Search ............ 134/1.1, 134/1.3, 2, 3, 26, 28, 27, 29, 34, 36, 41, 902
See application file for complete search history.

(56) References Cited

U.S. PATENT DOCUMENTS

| 6,211,035 B1* | 4/2001 | Moise et al. ........... 438/396 |
| 6,288,357 B1* | 9/2001 | Dyer ............... 219/121.41 |
| 6,453,914 B2* | 9/2002 | Torek et al. ............ 134/1.2 |
| 6,475,922 B1* | 11/2002 | Zheng .................. 438/725 |
| 6,533,948 B2 | 3/2003 | Kato et al. |
| 6,566,228 B1* | 5/2003 | Beintner et al. ......... 438/430 |
| 2001/0034106 A1* | 10/2001 | Moise et al. ........... 438/396 |
| 2002/0064920 A1* | 5/2002 | Trivedi .................. 438/305 |
| 2002/0127766 A1* | 9/2002 | Ries et al. .............. 438/94 |
| 2002/0177323 A1* | 11/2002 | Grewal et al. .......... 438/710 |
| 2004/0043526 A1* | 3/2004 | Ying et al. ............. 438/38 |

* cited by examiner

*Primary Examiner*—Sharidan Carrillo
(74) *Attorney, Agent, or Firm*—Rose Alyssa Keagy; W. James Brady; Frederick J. Telecky, Jr.

(57) ABSTRACT

An embodiment of the invention is a method of cleaning a material stack 2 that has a hard mask top layer 8. The method involves cleaning the material stack 2 with a fluorine-based plasma etch. The method further involves rinsing the material stack 2 with a wet clean process.

16 Claims, 1 Drawing Sheet

FRAM CAPACITOR STACK CLEAN

BACKGROUND OF THE INVENTION

This invention relates to a method of cleaning the surface of a ferroelectric capacitor stack in ferroelectric random access memories.

DETAILED DESCRIPTION OF THE INVENTION

Figure 1:
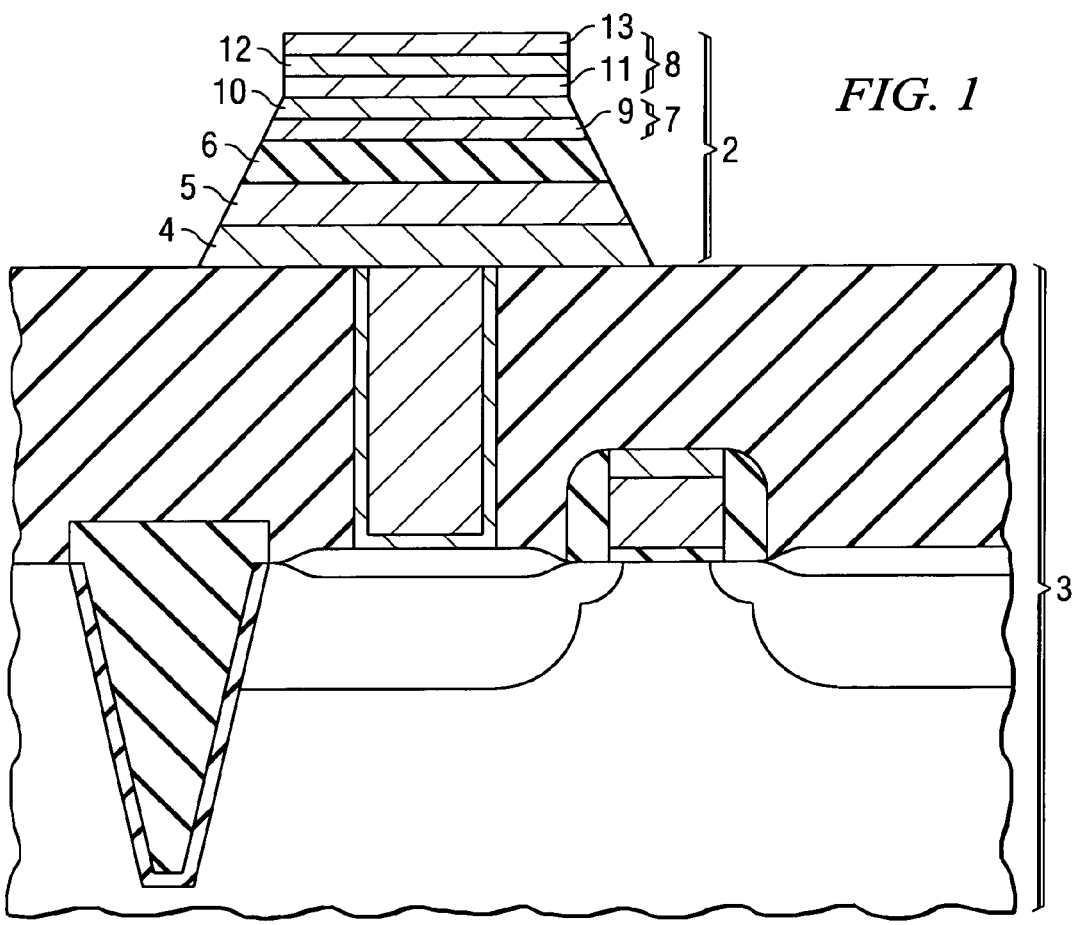
FIG. 1 is a cross-section view of semiconductor wafer having a ferroelectric capacitor stack.

The present invention is described with reference to the attached figures, wherein similar reference numerals are used throughout the figures to designate like or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Referring to the drawings, FIG. 1 depicts a cross-section view of a ferroelectric capacitor stack 2. The ferroelectric capacitor stack 2 is located within a ferroelectric random access memory ("FRAM") array. In turn, the FRAM array is located between the standard logic front-end 3 and back-end (not shown) of an integrated circuit. The front-end 3 of the wafer (i.e. the portion closest to the substrate) contains the transistor logic while the FRAM array contains non-volatile memory. The device's interconnects and metal lines—used to move electrical signals and power throughout the device—are contained in the back-end portion of the integrated circuit (i.e. fabricated over the FRAM array). Other than the process for cleaning the ferroelectric capacitor stack 2 (described herein), the processing steps for creating the ferroelectric memory array is any known fabrication process, such as the fabrication process described in the commonly assigned patent U.S. Pat. No. 6,548,343 (Ser. No. 09/702,985, TI Docket Number TI-29970, filed Oct. 31, 2000), incorporated herein by reference and not admitted to be prior art with respect to the present invention by its mention in this section.

In general, a single capacitor memory cell (referred to as a "1T/1C" or "1 C" memory cell) has one transistor and one storage capacitor. Furthermore, as shown in FIG. 1, the bottom electrode 5 of the ferroelectric storage capacitor is generally electrically connected to the drain of a transistor. In the example application shown in FIG. 1, the FRAM memory array is located between the front-end module and the back-end module. However, other locations for the FRAM memory array are within the scope of this invention. For example, the FRAM array may be placed over the first level of metallization or near the top end of the back-end module. Furthermore, it is within the scope of this invention to have a FRAM array containing a dual capacitor memory cell (comprising two transistors and two ferroelectric capacitors) instead of a single capacitor memory cell.

In the example wafer structure shown in FIG. 1, a barrier layer 4 is located between the front-end module 3 and the bottom electrode 5 of the ferroelectric capacitor. However, the use of a barrier layer is optional. If a barrier layer is used, it may protect the conductive material located in the front-end module 3. Furthermore, a barrier layer may allow the oxygen stable bottom electrode material to be thinner or allow a higher process temperature to be used. In example application, the barrier layer 4 is comprised of TiAlN.

The FRAM memory array contains numerous FRAM memory cells. The ferroelectric capacitor stack 2 within a FRAM memory cell contains ferroelectric material, such as lead zirconate titanate (called "PZT" based on its chemical formula: $Pb(Zr,Ti)O_3$) that functions as a capacitor dielectric 6 situated between a bottom electrode 5 and a top electrode 7. In an example application, the bottom electrode 5 is comprised of Ir and the top electrode 7 is comprised of a stack of IrOx 9 and Ir 10.

Together, layers 11, 12, and 13 form a hard mask 8. The hard mask 8 facilitates the proper shaping of the ferroelectric capacitor stack 2 during the fabrication process. In the example application the hard mask 8 is comprised of a material stack of TiAlN 11, TiAlON 12, and TIAlN 13. The hard mask 8 is made thick enough to retain its integrity during all etch processes (i.e. 50–500 nm thick). Furthermore, the hardmask is comprised of layers of conductive material in order to electrically couple the ferroelectric capacitor's top electrode 7 to the rest of the FRAM array and/or the back-end module. In this example application, the hard mask 8 is comprised of a top and bottom layer of TIAlN separated by a middle layer of TiAlON; however the hardmask may be comprised of TiN, AlN, Ti, $TiO_2$, Al, AlOx, TiAl, TiAlOx, or any stack or combination thereof.

Figure 2:
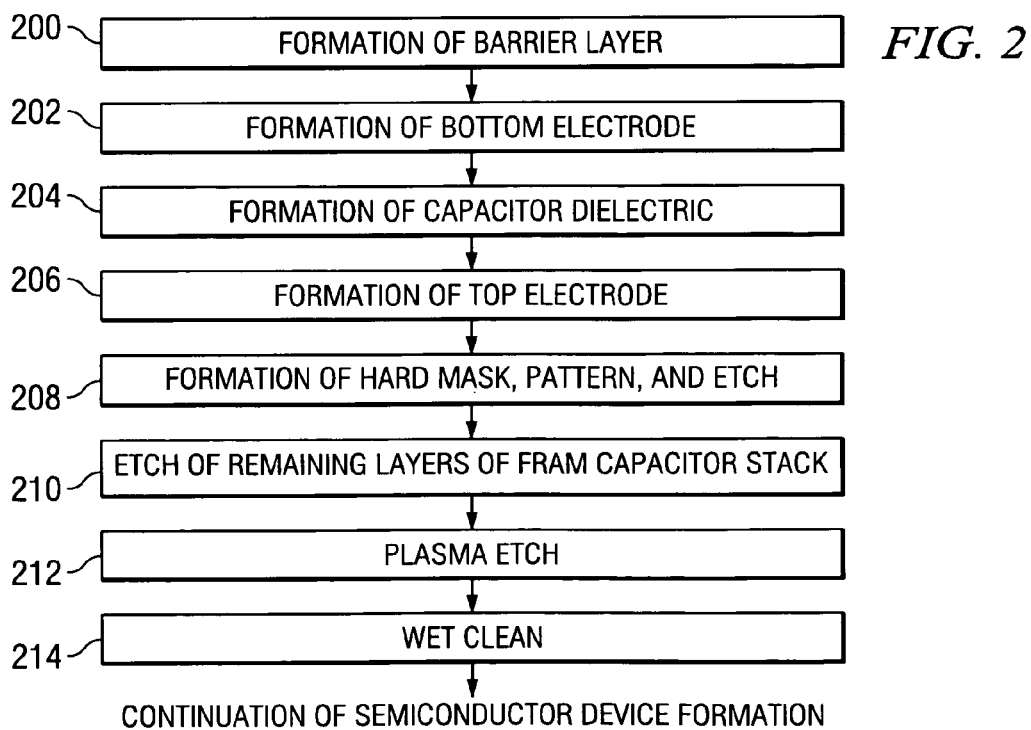
FIG. 2 is a flow diagram illustrating the process flow of the invention.

Referring again to the drawings, FIG. 2 is a flow diagram illustrating the process flow of the invention. Other than process steps 212 and 214, the process steps should be those that are standard in the industry.

Step 200 is the optional formation of a barrier layer 4 over the front-end module 3. Preferably, the barrier layer 4 is formed by depositing TIAlN by reactive sputter deposition. However, other deposition techniques such as chemical vapor deposition ("CVD") or plasma enhanced CVD ("PECVD") may be used. Next, the bottom electrode layer 5 is formed (step 202) on the barrier layer 4 or directly on the front-end module 3. In the example application, the bottom electrode is comprised of iridium that is deposited by sputter deposition.

The capacitor dielectric layer 6 is formed on the bottom electrode layer 5 (step 204). The capacitor dielectric is PZT in the example application because it has the highest polarization and the lowest processing temperature of the available ferroelectric materials. However, other ferroelectric materials may be used, such as doped PZT, doped and alloyed PZT, or strontium tantalite and other layered perovskites. The preferred deposition technique for PZT is metal organic chemical vapor deposition ("MOCVD"). However other deposition techniques may be used, such as sol-gel or metal organic decomposition.

The top electrode layer 7 is formed (step 206) on the capacitor dielectric layer 6. In the example application, the top electrode is comprised of two layers (9, 10). However, the top electrode can be formed using just one layer. In the example application, the iridium layer 9 is deposited by physical vapor deposition ("PVD") and the iridium oxide layer is deposited by reactive PVD.

In step 208, the hard mask layer 8 is formed, patterned, and etched. In the example application the hard mask 8 is formed by a material stack consisting of TiAlN 11, TiAlON 12, and TiAlN13. Preferably, all of these layers are deposited by sputter deposition in the same chamber where the film composition is changed during the deposition process by varying the gas composition.

Any conventional form of patterning can be used to pattern the hard mask 8, but a photoresist mask is preferable. After the photoresist is patterned then the hard mask 8 is etched (for example, using chlorine chemistries). After the hard mask 8 is etched the photoresist is removed with a conventional ash process.

Using the patterned hard mask 8 as a template, a plasma chamber is now used to etch (step 210) the remaining layers of the ferroelectric capacitor stack 2. Generally multiple etch processes are used to etch the various layers of the ferroelectric capacitor stack 2.

The plasma etch process leaves contamination on the FRAM capacitor stack 2; therefore, the next step is to remove the etch damage and/or residues with a post-etch clean. In accordance with the present invention, the unwanted material is removed from the semiconductor wafer using a cleaning process comprised of a plasma etch (step 212) and a wet clean (step 214). In the best mode application, the plasma etch clean (step 212) is performed in the same machine as the capacitor stack etch (step 210). As an example, the machine used for the stack etch and the plasma etch clean may be the Mattson Asher. In an alternative application, an etcher made by Applied Materials ("AMT") uses a directional etch process to form the capacitor stack and then a Mattson Asher uses an isotropic plasma etch to perform the plasma etch clean.

In the best mode application, the plasma etch clean (step 212) is performed using $CF_4/O_2$ as the etchant. More specifically, a diluted $CF_4/O_2$ etchant (i.e. 0.5–2% $CF_4$) is used under low pressure (~1.0 mTorr), moderate source power (i.e. 1200 W), no bias power, and a low temperature (~60° C.) for a moderate period of time (i.e. 40–80seconds). However, it is within the scope of this invention to use any isotropic fluorine-based plasma etch with appropriate processing conditions to accomplish the stack etch clean.

After the fluorine-based plasma etch (step 212) a wet clean process (step 214) is performed in order to remove fluorine and any remaining unwanted material (such as IrF, PbF, and TiF). In the best mode application, the wet clean is a two step process comprising a rinse with deionized water followed by a rinse with an aqueous acidic solution such as a dilute hydrochloric acid solution.

During the wet clean process (step 214) the wafers are rinsed in a tank using an appropriate process such as a quick dump rinse. The tank contains deionized water that removes fluorine and other soluble etch residues. After the deionized water rinse, the wafers are transferred to another tank that contains a solution of dilute hydrochloric acid. For example, the solution may be +1:10 $HCl:H_2O$ at 30° C. and the wafers may be held in the tank for approximately 200 seconds. The dilute HCl process is followed by an appropriate deionized water rinse process such as a quick dump rinse. The hydrochloric acid rinse removes remaining fluorine and other unwanted materials. However, the hydrochloric acid rinse may also cause a slight additional etching of the surface of the ferroelectric capacitor stack 2.

The use of solutions containing other concentrations of hydrochloric acid is with in the scope of this invention. Moreover, the use of other wet clean processes is within the scope of this invention. For example, after the deionized water rinse the wafers may be further rinsed with an organic solvent (i.e. ethyl alcohol), sulfuric acid, or phosphoric acid instead of hydrochloric acid.

Alternatively, the wet clean process may be only a deionized water rinse. Furthermore, the wet clean process may consist of only a phosphoric acid rinse, only a hydrochloric acid rinse, only a sulfuric acid rinse, or only an organic solvent rinse.

Other modifications to the invention as described above are within the scope of the claimed invention. As an example, the wet clean process (step 214) may be performed in an ultrasonic tank. In addition, the wet clean process may consist of numerous rinses in solvent, acid or aqueous solutions.

The clean up plasma etch (step 212) described above may be performed using any other well known machine generating an isotropic plasma. In addition, the same chamber of the plasma etcher may be used for more than one of the above described etch processes. In addition, instead of $CF_4/O_2$, any other fluorine-based etchant, such as $C_2F_6$ or $NF_3$, may be used for the clean up etch.

Instead of using PZT as the ferroelectric material, other materials such as $SrBi_2Ta_2O_9$ may be used. Furthermore, instead of using this invention to fabricate planar ferroelectric capacitors, it may be used to fabricate the three dimensional cup-shaped capacitor. As an example, this invention could be used to fabricate capacitor under bitline structures.

Instead of forming the bottom electrode, 5, on the barrier layer, 9, the bottom electrode, 5, may be formed directly on the front-end module 3. In addition, instead of SiC, the barrier material 4 may be silicon nitride, silicon oxide, nitrogen-doped silicon carbide, or oxygen-doped silicon carbide. Furthermore, instead of Ir, the bottom electrode may be comprised of other materials such as Pt, $IrO_2$ or $SrRuO_3$. Similarly, instead of Ir/IrOx, the top electrode may be comprised of other materials such as Pt, $IrO_2$, or $SrRuO_3$.

This invention can be used in the fabrication of standalone FRAM devices or FRAM devices integrated into a semiconductor chip that has many device functions other than those described herein. Moreover, the invention is applicable to semiconductor wafers having different well and substrate technologies, transistor configurations, and metal connector materials or configurations. The invention is also applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of cleaning a semiconductor wafer having a material stack having a hard mask top layer comprising:
   etching said material stack with a fluorine-based plasma etchant; and
   rinsing said material stack with a wet clean process.

2. The method of claim 1 wherein said material stack is a ferroelectric capacitor.

3. The method of claim 1 wherein said fluorine-based plasma etchant is $CF_4/O_2$.

4. The method of claim 1 wherein said fluorine-based plasma etchant is $NF_3$.

5. The method of claim 1 wherein said fluorine-based plasma etchant is $C_2F_6$.

6. The method of claim 1 wherein said wet clean process is a deionized water rinse.

7. The method of claim 1 wherein said wet clean process is a deionized water rinse followed by a hydrochloric acid clean process.

8. The method of claim 1 wherein said wet clean process is a deionized water rinse followed by a phosphoric acid clean process.

9. The method of claim 1 wherein said wet clean process is a deionized water rinse followed by an organic solvent clean process.

10. The method of claim 1 wherein said wet clean process uses an organic solvent.

11. The method of claim 1 wherein said wet clean process uses phosphoric acid.

12. The method of claim 1 wherein said wet clean process uses dilute hydrochloric acid.

13. The method of claim 1 wherein said wet clean process uses sulfuric acid.

14. The method of claim 1 wherein said rinsing step further etches said material stack.

15. The method of claim 1 wherein said rinsing step includes the use of ultrasonic energy.

16. The method of claim 1 wherein a top surface of said hard mask top layer comprises TiAlN.

* * * * *